United States Patent [19]
Yu

[11] Patent Number: 5,654,233
[45] Date of Patent: Aug. 5, 1997

[54] STEP COVERAGE ENHANCEMENT PROCESS FOR SUB HALF MICRON CONTACT/VIA

[75] Inventor: Chen-Hua Douglas Yu, Hsin-Chu, Taiwan

[73] Assignee: Taiwan Semiconductor Manufacturing Company Ltd, Hsin-Chu, Taiwan

[21] Appl. No.: 630,710

[22] Filed: Apr. 8, 1996

[51] Int. Cl.$^6$ ................................. H01L 21/283
[52] U.S. Cl. .................. 438/643; 438/644; 438/672; 438/712; 438/720; 438/653; 438/654
[58] Field of Search .................. 437/189, 190, 437/192, 195, 228; 257/751, 753, 763

[56] References Cited

U.S. PATENT DOCUMENTS 5,187,120  2/1993  Wang ........................ 437/192

FOREIGN PATENT DOCUMENTS 63-81833  4/1988  Japan.
6-163718  6/1994  Japan.

*Primary Examiner*—T. N. Quach
*Attorney, Agent, or Firm*—George O. Saile

[57]   ABSTRACT

A Process for creating a planar topography and enhanced step coverage for the fabrication of contact/via holes in sub-half-micron diameter range with high height vs. dimension aspect ratio. This is accomplished by interrupting the deposition of the barrier layer in the contact/via lining with a programmed reactive ion etching process, which will protect the thin barrier lining in the bottom part of the contact hole, but will etch off and planarize the excessively thick barrier layer near the opening of the hole. The resulting barrier layers show a disrupt columnar film structure which provides better barrier during subsequent metal fill deposition process.

33 Claims, 4 Drawing Sheets

STEP COVERAGE ENHANCEMENT PROCESS FOR SUB HALF MICRON CONTACT/VIA

BACKGROUND OF THE INVENTION (1) Field of the Invention

The present invention relates to the fabrication of integrated circuits and more particularly to a process used to fill contact/via holes of sub-half-micron in dimension.

(2) Description of Prior Art

The semiconductor integrated circuit industry is continually to micro-miniaturization i.e. to produce semiconductor devices of sub-micron and sub-half-micron features with increase performance and still lowering the cost of manufacturing. The use of sub-half-micron features allows more extremely small chips to be obtained from a specific size starting silicon wafer, thereby not only the cost of a specific chip is reduced, but the performance of the devices is also enhanced due to reduction in resistance and capacitance. However, the use of sub-half-micron features invariably increases the risk of yield and reliability failure.

In order to form an electrical interconnect/via for a multilayer semicondcutor integrated circuit, the via holes are filled with metal, such as aluminum or tungsten. The conventional aluminum deposition techniques such as sputtering or evaporation have difficulty in conformally filling via holes. Furthermore, the small diameter aluminum contact/vias can not sustain the high current density requirement, and invariably have reliability failures as a result of electromigration. Currently, the semiconductor manufacturing industry has switched to the use of tungsten for filling these sub-micron and sub-half-micron contact/via holes, on account of the improved conformality characteristics of the low-pressure chemical vapor deposited (LPCVD) tungsten. In addition, the high current carrying property of tungsten reduces the risk of electromigration failures found in aluminum filled contact/vias. However, the LPCVD tungsten tends to leave a buried void or seam in the center or middle of the contact/via upon completion of the deposition, due to the nature of the LPCVD process, i.e. it fills the via hole from the side and edge of the via. This buried void or seam in the tungsten fill is generally the result of excessive build-up of the underlying barrier layer around the top edge and along the upper portion of the wall of the via opening, thus prevent flow of source material to the center and lower portion of the via hole during subsequent metal fill deposition. Furthermore, this buried void or seam formed in the middle of the contact/via is usually exposed during the subsequent processing, such as dry etching process. The size of the seam or the void in the tungsten contact becomes larger, and creates difficult topography for subsequent metallization coverage. Many processes and techniques have been developed attempting either to patch-up the void or seam or to produce a seamless tungsten contact hole fills.

One of the conventional processes used for Tungsten via hole fill is by depositing an underlayer of electrically conductive Titanium Nitride or Tungsten nitride film which promotes nucleation of Tungsten deposition. One of the problems encountered in the deposition of these titanium nitride or tunsten nitride film by the conventional Plasma Vapor Deposition (PVD) in extremely small via openings, such as sub-micron contact/vias, where the aspect ratio, i.e. ratio of the depth of the contact hole to the diameter opening, is large, the thickness of TiN film deposited on the bottom of the hole is severely limited due to the pinch-off effect around the top opening of the hole by the uneven build-up of the TiN film around the top edge of the via opening.

To circumvent this problem, Shein-Sen M. Wang, in U.S. Pat. No. 5,187,120 has described a selective chemical vapor deposition (SCVD) method which preferentially deposits tungsten in the via opening but resists deposit of tungsten on the oxide exposed surface. This method consists of depositing a layer of a first phase of titanium nitride or tungsten nitride by either, which promotes nucleation of tungsten followed by the deposition of the oxide layer, the wall of the opening, and an overlayer of a second phase of titanium nitride or tungsten nitride which resists nucleation of tungsten on the oxide exposed surface. The SCVD process described by Wang is an extremely complicated long and costly process, it consists of first forming a $TiSi_x$ (titanium silicide) layer with predetermined electrical conductivity, followed by implantation of Nitrogen ion into the $TiSi_x$ layer to form a first phase TiN layer within the $TiSi_x$ layer, forming an oxide layer over the N implanted $TiSi_x$ layer, forming another layer of second phase TiN on the exposed oxide surface by careful sputtering of CVD on the oxide layer, etching the via opening and exposing the TiN at the bottom of the opening, rapid thermal annealing, and selectively depositing tungsten by the Silane/tungsten hexaflouride process.

This invention will describe a process which will eliminate the thick pinch-off effect of the conventional physical vapor deposition (PVD) TiN film around the top edge of the contact/via openings without the cost of deposition of two different phases of CVD (Chemical Vapor Deposition) metal nitride films described by Wang. This invention disclosed a TiN etching process which is introduced to remove the thick PCV TiN at the top and near the top of the contact/via opening without reducing the thickness of the TiN films on the wall of the lower part of the hole and the bottom of the hole. This is followed by redeposit a second TiN film, thereby, the total thickness of TiN film in the bottom and the lower wall of the via opening is equivalent to the TiN film on the top, hence a uniform barrier layer of TiN lining is created in the contact/via hole. Furthermore, the second add-on TiN layer disrupts the columnar grain of the first TiN layer. Consequently, the resulting TiN layer provides a better barrier layer and promotes more uniform nucleation sites for subsequent tungsten fill deposition.

SUMMARY OF THE INVENTION

It is an object of this invention to provide a process for fabricating tungsten filled contact holes, to be used to connect active semiconductor device regions in a semiconductor or oxide substrate, to an overlying metallization.

It is another object of this invention to provide a uniform disrupt-columnar underlying electrically conductive film in the sub-micron or sub-half-micron contact/via openings for nucleation of subsequent deposition of metal fills.

It is another object of this invention to provide a uniform nucleation underlying electrically conductive film in the sub-micron or sub-half-micron contact/via openings over a thin metal film, which promotes low resistance contact to the underlying heavily doped semiconductor substrate.

It is another object of this invention to deposit this underlying film by the conventional plasma deposition process showing protruding and overhanging of thick barrier film around the top edge of the contact/via opening, and around the upper portion of the wall of the opening.

It is yet another object of this invention to provide a dry etch process to remove partially the thick electrically conductive film that protrudes and overhangs around the top edge of the via opening, and around the wall near the top of the small contact hole, but not reduce the thickness of the thin barrier layer at the bottom or around the lower portion of the wall of the small contact hole.

It is still another object of this invention to provide a dry etch process to remove selectively the thick overhang of the underlying electrically conductive film around the top portion of the via hole, without deteriorating the integrity of the adhesive intermediate layer of metal underneath this underlying electrically conductive film, and allowing more deposition of subsequent barrier layer or via hole metal in the lower portion of hole with the elimination of the blocking of the deposition by the overhang.

It is still another object of this invention to redeposit the underlying film the second time, to provide more barrier lining in the bottom and around the lower portion of the sub-micron or sub-half-micron via hole against fluorine corrosion which is released during the subsequent tungsten deposition process using tungsten hexaflouride source.

It is still another object of this invention to fill small diameter, i.e. sub-micron or sub-half-micron diameter, of high aspect ratio contact holes with tungsten or other metals with high current carrying properties and planar topography at the end of this process.

In accordance with the present invention a process is described to provide an improved step coverage method for the sub-micron or sub-half-micron contact/via, by using the conventional PVD TiN deposition process coupled with a selective reactive etching process which etches off only the overhang.

Contact holes are patterned and opened by the photolithographic process and holes are formed by the reactive ion etching in a dielectric layer to an active device region in a semiconductor substrate. A layer TiN is deposited using the conventional manufacturing plasma vapor deposition process. In some instance, where an adhesive Ti intermediate layer is required, the Ti film is deposited prior to the deposition of the TiN film. A high pressure RIE processing procedure is designed to selective etch away the TiN overhang around the top of the via opening and the TiN film around the upper portion of the wall of the opening without deteriorating the wall of the hole or thinning down the TiN at the bottom or around the lower wall of the hole. And in case of an intermediate Ti layer is used, the special designed RIE process will not affect the Ti film. The columnar structure of the PVD TiN film invariably provides an easy access path for the fluorine, a by-product of the subsequent tungsten deposition process, to attack the underlying Ti, via the boundaries between the TiN columns as in the conventional fabrication process. By depositing a second layer of PVD TiN, the aforementioned attack by the fluorine gas can be eliminated or minimized due to the misalignment of the columns of this second layer of PVD TiN to the columns of the underlying first PVD TiN and resulting the disruption of the boundaries running from the surface directly to the underlying Ti metal. This double PVD TiN film deposition in combination with the in-between RIE removal of the overhang on the top of opening, provide reliable protection against the fluorine attack to the lining of the hole, especially in the lower portion of the contact hole. Tungsten metal is then deposited using the tungsten hexaflouride and hydrogen and silane process.

DESCRIPTION OF THE PREFERRED EMBODIMENTS

The method of fabricating and manufacturing a high current carrying metal filled contact/vias of sub-micron or sub-half-micron in diameter will now be described. This invention can be used in MOSFET or CMOS or any high density semiconductor devices that are currently being manufactured in the semiconductor industry, but only the specific areas unique to understanding this invention will be covered in detail.

Figure 1:
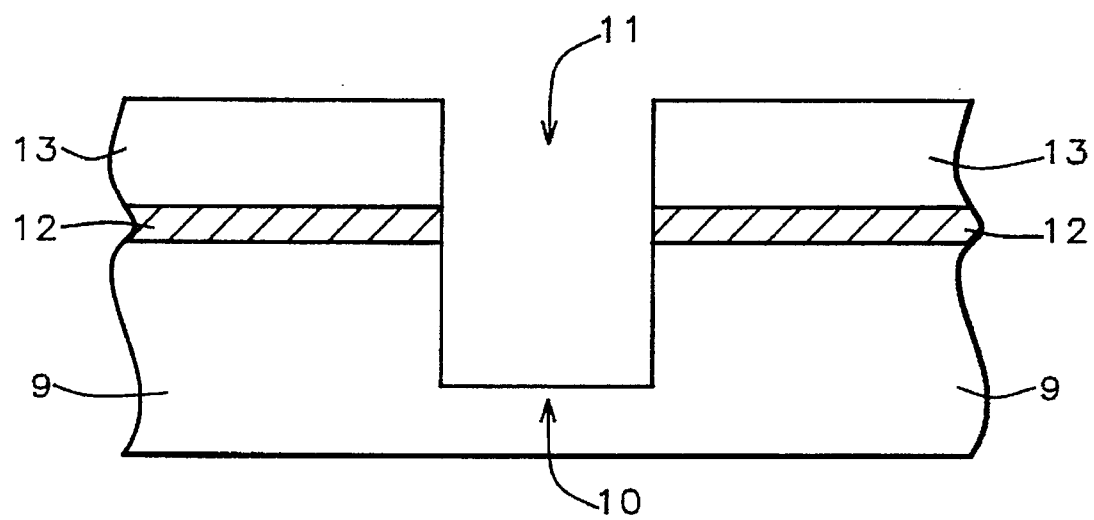
FIG. 1 is a cross-sectional view of a contact/via after etching.
Figure 2A:
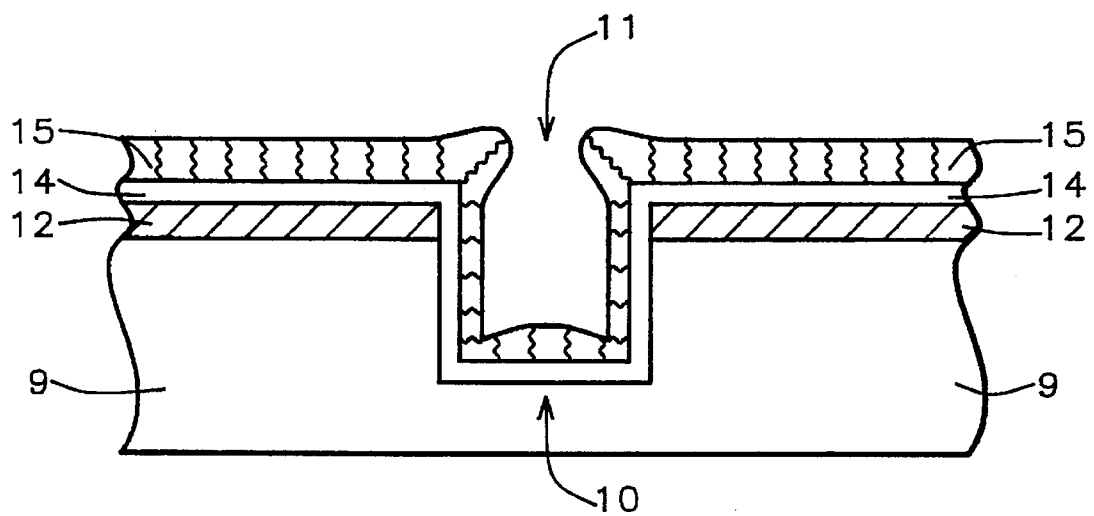
FIG. 2A shows a cross-sectional view of the small contact/via after the depositions of the adhesive metal layer and the first metal nitride barrier layer.
Figure 2B:
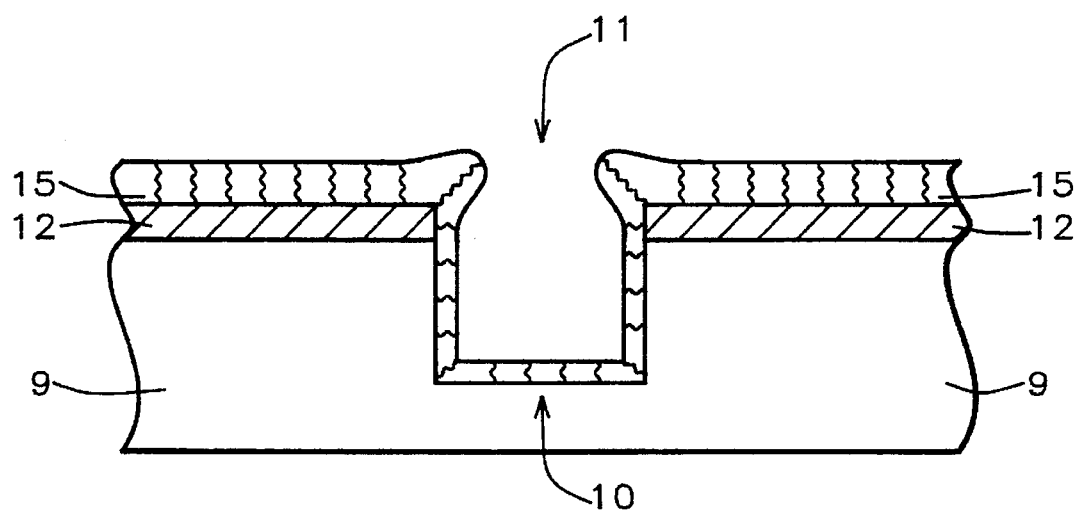
FIG. 2B shows a cross-sectional view of the small contact/via after the deposition of the first metal nitride barrier layer.
Figure 3A:
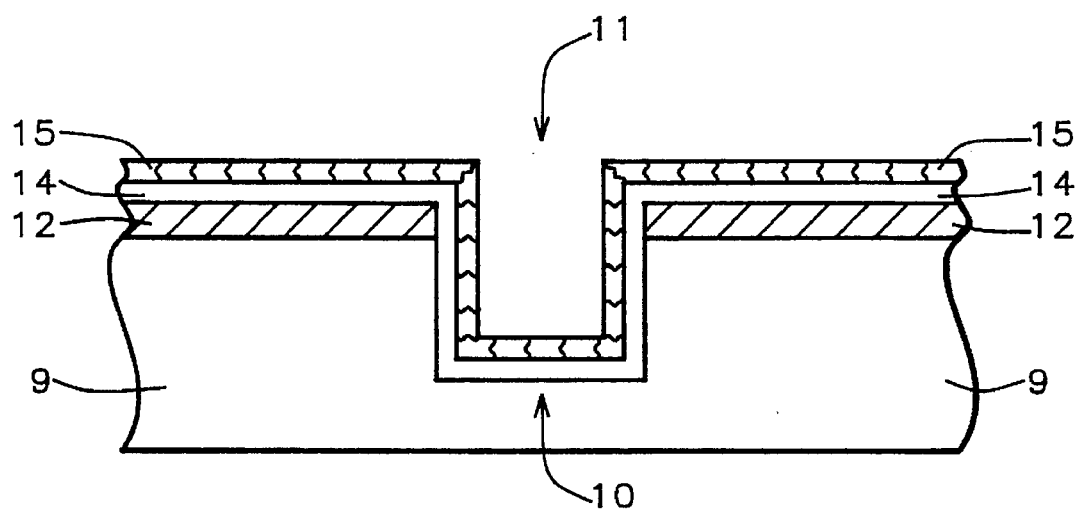
FIGS. 3A & 3B show schematically in cross-sectional views the small contact/via holes lined with metal adhesive layer and without adhesive layers, respectively after the multiple-stage RIE etching for the removal of the protrusion and overly thick first barrier layer around the top of the via hole.
Figure 3B:
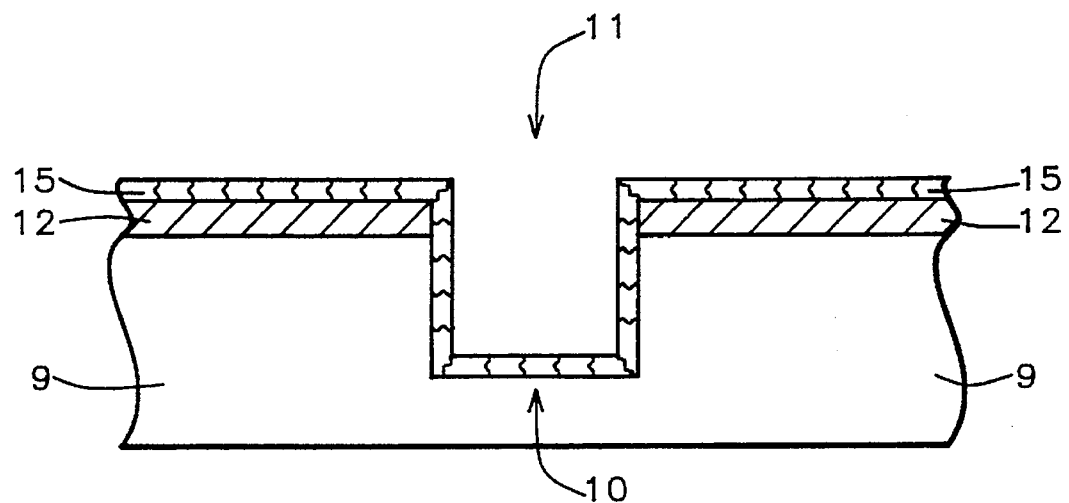
Figure 4A:
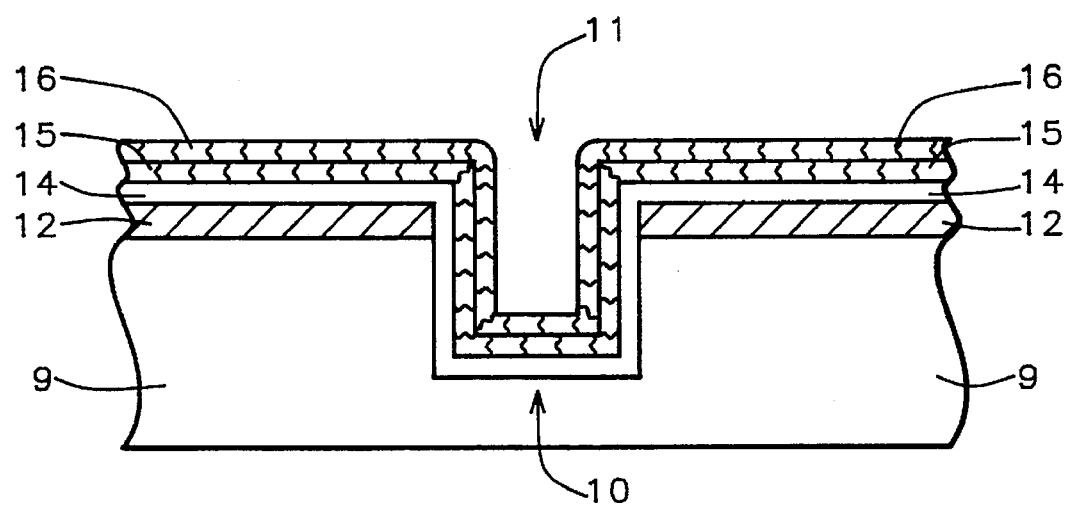
FIGS. 4A & 4B shows schematically in cross sectional view of the small via after metal fill.
Figure 4B:
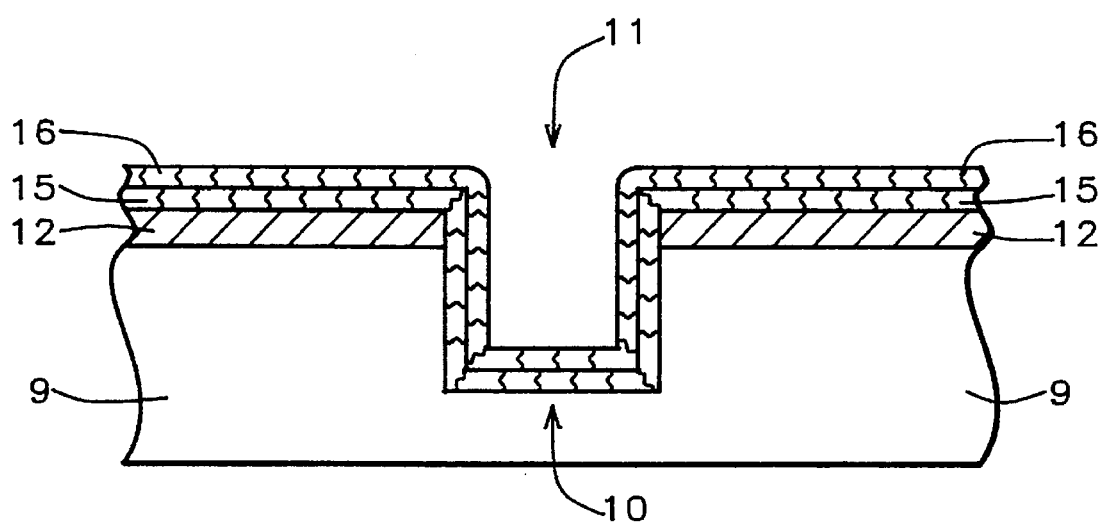

FIG. 1 shows an embodiment of an opening of sub-micron or sub-half-micron size in diameter, 11, that will be the contact/via for interconnect which this invention will be applied to. A layer of silicon oxide, 12, is deposited using either low pressure chemical vapor deposition (LPCVD) or atmospheric pressure chemical vapor deposition (APCVD) or plasma enhanced chemical vapor deposition processing at a temperature between about 400 to 800 deg. C. to a thickness between about 500 to 1000 nm. The contact/via opening is exposed by patterning over this oxide layer, 12, with the conventional photolithographic procedure. Photoresist of thickness in the range between 1.0 to 1.4 um is applied and then case-hardened to withstand the subsequent dry etching process, in order to protect the oxide under the photoresist. The sub-micron or sub-half-micron hole is formed by the dry etching technique, such as reactive ion etching, using $CHF_3$, $CH_4$ and Ar as etchants to a depth in the range of 0.4 to 1.0 microns. Following this RIE procedure, a cleaning process, such as oxygen ashing is used to remove the residual photoresist, 13, left on the oxide surface, 12. This is followed by a wet cleaning step using buffered hydrofluoric acid pre-clean or Ar sputter clean. This pre-clean procedure does not deteriorate the exposed oxide nor the Si in the via hole. In certain cases, as shown in FIG. 2a, an adhesion promotion Ti layer, 14, in the range of 15 to 25 nm is deposited via collimated, r.f. sputtering process. The titanium layer, 14, provides a low resistance contact to the heavily doped silicon region, and also serves as a low resistance adhesion to the subsequent electrically conductive TiN layer. The use of collimation for the deposition allows for a more effective deposition of titanium at the bottom of contact hole, 10. After the Ti layer is formed as the liner in the via hole and over the surface oxide, a barrier layer of collimated TiN layer, 15, shown in FIGS. 2a and 2b having a thickness in the range of 30 to 140 nm is deposited using the physical vapor deposition technique. This TiN barrier layer, 15, offers protection to the underlying materials during the subsequent tungsten depositions. During the tungsten deposition process, the by-products resulted from the decomposition of source tungsten hexafluoride would attack the underlying titanium layer, 14, or silicon, 9, or the oxide, 12. A predetermined RIE processing step which consists of using a combination of $BCl_3$, chlorine and $N_2$ gases with the respective flow rates of 65 to 75 sccm, 40 to 50 sccm, and 20 to 30 sccm at pressures around in the range of 180 to 225 mTorr, for an etch rate of 5.0 to 6.5 nm per second. This dry etch process is ended when approximately 60–80% of the overhang of the underlying film around the top of the sub-micron or sub-half-micron via hole opening is etched off, and the top opening of the hole is no longer restricted by the overhang, thus insure uniform coverage of films or metals at the bottom and lower portion of the via holes during subsequent deposition processes. At the end of this tailored RIE method, the TiN thickness at the bottom of the via hole and around low portion of the via hole's wall shows no reduction in thickness, or shows a slight reduction of less than 10 percentage of the original thickness, as shown in FIGS. 3a & 3b, for holes with and without metal adhesive underlayer, respectively. A conventional wet-cleaning step which does not affect the lining of the sub-micron or sub-half-micron via hole, is applied to remove any RIE residue left in the via hole. A second columinated TiN layer, 16, of thickness in the range of 30 to 80 nm is deposited by the same PVD process. This second layer of TiN evens out the total TiN thickness around the bottom portion of the via hole lining and at the bottom of the via hole with that on the top, as shown in FIGS. 4a and 4b, hence allowing even flow of deposition gases for subsequent tungsten deposition and providing a planar topography for tungsten filled contact/via with minimum voids or seams in the center of these high aspect ratio contact/vias. Next the tungsten fill is deposited using low-pressure chemical vapor deposition processing at a temperature between about 300 to 600 deg. C. to a thickness between about 250 to 800 nm. using tungsten hexafluoride and hydrogen and or silane mixture.

This process, although shown for forming self-aligned tungsten filled contact holes, connecting overlaying interconnect metallization structures to underlying active silicon device regions, can also be applied to tungsten structures filling via holes, used to interconnnect two levels of metallizations.

While this invention has been particularly shown and described with reference to, the preferred embodiments thereof, it will be understood by those skilled in the art that the foregoing and other changes in form and details may be made therein without departing from the spirit and scope of this invention.

What is claimed is:

1. A method for fabricating MOSFET, and CMOS, devices on a semiconductor substrate using a metal filled contact hole to provide electrical contact between an underlying conductive region on said semiconductor substrate and an overlying interconnect metallization structure, comprising the steps of:

providing said underlying conductive region, on said semiconductor substrate;

depositing a dielectric layer on said semiconductor substrate, including deposition on said underlying conductive region;

anisotropic etching of said dielectric layer in sub-half-micron holes, defined by a photolithographic process to form sub-half-micron contact holes to said underlying conductive region;

depositing a metal adhesion layer on top surface of said dielectric layer, on walls of said subhalf-micron contact holes and top surfaces of said underlying conductive regions, in said small contact holes;

depositing a first collimated barrier layer on said adhesive layer;

dry etching off partially, in the range of 60 to 80 percent of the top portion of said barrier layer that overhangs and protrudes over the rim of said sub-half-micron contact hole and reduces only the top opening diameter of said contact hole, but not the barrier layer thickness at the bottom and around the lower portion of said sub-half-micron contact hole, by varying the mixture composition of etchant gases and the time of etching;

depositing a second collimated barrier layer over the surface of the unetched portion of said first collimated barrier layer around the top portion of the hole and over the unetched said barrier layer on the bottom portion of said sub-half-micron contact hole to create a uniform barrier layer with disrupted columnar grains lining the contact opening and over the surface to prevent metal penetration during subsequent metal contact processing; and depositing a metal fill layer on said uniform barrier layer, forming a metal plug in said small diameter contact hole by completely filling said sub-half-micron contact hole with said metal fill layer.

2. The method of claim 1, wherein said first barrier layer is collimated titanium nitride deposited using physical vapor deposition process (PVD) at a temperature between about 200 to 400 deg. C. to a thickness between 30 to 140 nm.

3. The method of claim 1, wherein said first deposited barrier layer protrudes and overhangs around the top rim and the top portion of the hole is planarized using a multi-step reactive ion etching with etchant mixtures composed of $BCl_3$ and chlorine at a temperature about between 20 and 200 deg. C under the pressure about 30–300 mtorr in timed etched mode.

4. The method of claim 1, wherein the second collimated barrier layer is titanium nitride (TiN), deposited using PVD processing, at a temperature between about 200 to 400 deg. C., to create a uniform, disrupted columnar layer with total thickness in the contact hole ranging between 30 to 80 nm over the underlying metal adhesion layer and the unetched first TiN layer.

5. The method of claim 1, wherein said underlying conductive region, on said semiconductor substrate is a N type, heavily doped source and drain region of said MOSFET and CMOS devices.

6. The method of claim 1, wherein said underlying conductive region on said semiconductor substrate is a P type, heavily doped source and drain region of said MOSFET and CMOS devices.

7. The method of claim 1, wherein said underlying conductive region, on said semiconductor substrate, is a polysilicon gate structure of said MOSFET and CMOS device.

8. The method of claim 1, wherein said dielectric layer is silicon oxide, deposited using a chemical vapor deposition process where said chemical vapor deposition process is selected from the group consisting of low pressure chemical vapor deposition (LPCVD), plasma enhanced chemical vapor deposition (PECVD) and atmospheric pressure chemical vapor deposition (APCVD), at a temperature between about 400 to 800 deg. C. to thickness in the range of 500 to 1000 nm.

9. The method of claim 1, wherein said sub-half-micron contact hole is created using anisotropic reactive ion etching (RIE) processing, using etching mixtures of $CHF_3$, $CF_4$, $C_2F_6$, $C_4F_8$, $O_2$ and $N_2$, with said sub-half-micron contact hole being formed with an opening in the range of 0.25 to 0.8 micron in diameter, resulting in an aspect ratio between about 1 to 3.

10. The method of claim 1, wherein said adhesive layer is titanium, deposited using collimated r.f. sputtering to a thickness between about 10 to 40 nm.

11. The method of claim 1, wherein said metal fill layer is tungsten, deposited using LPCVD processing at a temperature between about 300 to 500 deg. C., to a thickness between about 200 to 800 nm using tungsten hexafluoride, hydrogen and silane and argon or helium as carrier gas.

12. A method for fabrication of MOSFET and CMOS devices on a semiconductor substrate using a tungsten filled contact hole to provide electrical contact between an underlying conductive region on said semiconductor susbstrate and overlying interconnect metallization structure, comprising the steps of:

providing said underlying conductive region on said semiconductor substrate;

depositing a dielectric layer on a semiconductor substrate, including deposition on a underlying conductive region;

anisotropic etching of said dielectric layer in sub-half-micron diameter hole, defined by a photolithographic process to form a sub-half-micron contact hole to said underlying conductive region;

depositing a titanium layer on the surface of diameter contact hole and on the top surface of said underlying conductive region in said sub-half-micron contact hole;

depositing a first collimated titanium nitride barrier layer on said titanium layer;

reactive ion etching to remove 60 to 80% of said first titanium nitride layer, which overhangs and protrudes over the rim surface of said sub-half-micron contact hole and reduces the top diameter of said hole opening without etching off said first titanium nitride barrier layer in the bottom and the lower portion of the sub-half-micron contact holes by varying the etchants compositions during the etching process;

depositing a second collimated titanium nitride barrier layer over said partially etched and thinned down first titanium nitride barrier layer around the upper portion of said sub-half-micron contact holes and over the unetched first titanium-nitride layer in the lower portion of said contact holes, to create a uniform TiN barrier layer with disrupted columnar grains over the surface and in the lining of said contact hole to prevent metal penetration during subsequent metal contact processing; and depositing a tungsten fill layer on said uniform titanium nitride barrier layer forming a metal plug in said sub-half-micron contact hole by completely filling said hole with tungsten fill layer.

13. The method of claim 12, wherein said titanium layer is deposited using collimated r.f. sputtering to a thickness between about 10 to 40 nm.

14. The method of claim 12, wherein said first titanium nitride barrier layer is deposited over said titanium layer using physical vapor deposition at a temperature between about 200 to 400 deg. C. to a thickness between about 30 to 140 nm.

15. The method of claim 12, wherein said first titanium nitride barrier layer which protrudes and overhangs around the top rim and upper portion of said sub-half-micron contact holes is removed using a multi-step reactive ion etching process with mixtures of etchants composed of $BCl_3$, chlorine, and nitrogen at a temperature about between 20 and 200 deg. C. under pressure of about 30 to 300 mtorr and in timed etched mode to remove about 60 to 80 percent of the top layer of the said first titanium nitride barrier layer, without affecting the underlying titanium layer.

16. The method of claim 12, wherein said second collimated titanium nitride barrier layer is deposited using PVD processing at a temperature between about 200 to 400 deg. C. to a total uniform thickness between about 40 to 140 nm over the partially etched and thinned down first barrier layer.

17. The method of claim 12, wherein said underlying conductive region on said semiconductor substrate is a N-type, heavily doped source and drain region of said MOSFET and CMOS devices.

18. The method of claim 12, wherein said underlying conductive region on said semiconductor susbstrate is a p-type heavily doped source and drain region of said MOSFET and CMOS devices.

19. The method of claim 12, wherein said underlying conductive region on said semiconductor substrate is a polysilicon gate structure of said MOSFET and CMOS devices.

20. The method of claim 12, wherein said silicon oxide dielectric layer is deposited using either LPCVD, PECVD or APCVD processing at a temperature between about 400 to 800 deg. C. to a thickness between about 500 to 1000 nm.

21. The method of claim 12, wherein said sub-half-micron diameter contact hole is created using anisotropic reactive ion etching (RIE) processing using $CHF_3$, $CF_4$, $C_2F_6$, $C_4F_8$, oxygen and nitrogen etchant mixture, with said sub-half-micron contact holes being formed with openings about 0.25 to 0.8 uM in diameter, resulting in aspect ratios between about 1 to 3.

22. The method of claim 12, wherein said tungsten fill is deposited using LPCVD processing at a temperature between about 300 to 500 deg. C., to a thickness between about 200 to 800 nm using tungsten hexafluoirde, hydrogen silane and argon or helium as carrier gas at pressures between 1.0 to 10 torr.

23. A method for fabricating MOSFET and CMOS devices on a semiconductor substrate to fill contact holes and to provide electrical contacts between an underlying conductive region on said semiconductor substrate and overlying interconnect metallization structures, comprising the steps of:

providing said underlying conductive region on said semiconductor substrate;

depositing a dielectric layer on said semiconductor substrate, including deposition on said underlying conductive region;

photolithographic processing to open holes of sub-half-micron in dimension in a photoresist layer, exposing said underlying dielectric layer, directly over an area of said underlying conductive region;

anisotropic etching of said dielectric layer in said sub-half-micron holes, in said photoresist layer to form sub-half-micron contact holes to said underlying conductive region;

depositing a titanium layer on the surface of said dielectric layer, on the wall of said sub-half-micron contact hole and on the top surface of said underlying conductive region in said sub-half-micron contact hole;

depositing a first layer of metal nitride barrier layer on said titanium layer, wherein said metal nitride is selected from the group consisting of Ta nitride, W nitride, Cr nitride and Mo nitride;

reactive ion etching to remove 60 to 80% of said first metal nitride layer which overhangs and protrudes over the rim surface of said small sub-half-micron contact hole and reduces the top diameter of said hole without etching off this first metal nitride barrier layer in the bottom and the lower portion of the sub-half-micron contact holes by varying the compositions of the reactive ion etchants during the etching process; surface cleaning of said sub-half-micron contact holes;

depositing a second layer of said metal nitride barrier layer over said partially etched and thinned down said first metal nitride layer around the upper portion of said sub-half-micron contact holes and over the unetched first said metal layer in the lower portion of said sub-half-micron contact hole, to create a uniform barrier layer with disrupted columnar grains over the surface and in the lining of said sub-half-micron contact hole to prevent metal penetration during subsequent metal contact processing; and depositing a metal fill layer, using a metal selected from the group consisting of Ta, Cr, and Mo, on said metal nitride barrier layer forming said metal plug in said sub-half-micron contact hole by completely filling said hole with metal fill layer.

24. A method for fabricating MOSFET and CMOS devices on a semiconductor substrate using a metal filled contact hole to provide electrical contact between an underlying conductive region on said semiconductor substrate and an overlying interconnect metallization structure, comprising the steps of:

providing said underlying conductive region on said semiconductor substrate;

depositing a dielectric layer on said semiconductor substrate, including deposition on said underlying conductive region;

photolithographic processing to open sub-half-micron holes in a photoresist layer, exposing said underlying dielectric layer, directly over an area of said underlying conductive region;

anisotropic etching of said dielectric layer in said sub-half-micron holes, in said photoresist layer to form sub-half-micron contact holes to said underlying conductive region;

depositing a first barrier layer over the said dielectric layer and over said underlying conductive regions in said sub-half-micron contact holes;

dry etching to remove the top portion of said first barrier layer which overhangs and protrudes over the rim of said sub-half-micron contact opening and reduces the top opening diameter of said contact hole by varying the mixture composition of the etchants, the time of etching and end-point on the surface oxide without affecting the integrity of the thin barrier layer lining the lower portion of the sub-half-micron contact hole;

surface cleaning of said sub-half-micron contact holes;

depositing a second layer of barrier layer over said first barrier layer which has been thinned down and planarized, and over the first barrier layer lining the lower wall and bottom of said sub-half-micron contact holes; and depositing a metal fill layer on said barrier layer, forming a metal plug in said sub-half-micron contact hole by completely filling said sub-half- micron contact hole with said metal fill layer.

25. The method of claim 24, wherein said underlying conductive region on said semiconductor substrate is a N-type, heavily doped source and drain region of said MOSFET and CMOS devices.

26. The method of claim 24, wherein said underlying conductive region on said semiconductor substrate is a p-type, heavily doped source and drain region of said MOSFET and CMOS devices.

27. The method of claim 24, wherein said underlying conductive region, on said semiconductor substrate, is the polysilicon gate structure of a said MOSFET and CMOS device.

28. The method claim 24, wherein said dielectric layer is silicon oxide, deposited using chemical vapor deposition processing selected from the group consisting of low pressure chemical Vapor Deposition (LPCVD), plasma enchanced chemical vapor deposition (PECVD) and atmospheric pressure chemical vapor deposition (APCVD), at a temperature between about 400 to 800 deg. C. to a thickness between about 500 to 1000 nm.

29. The method of claim 24, wherein said small diameter contact hole is created using anisotropic reactive ion etching (RIE) processing using $CHF_3$, $CF_4$, $C_2F_6$, $C_4F_8$, oxygen, and nitrogen etchant mixture, with said small diameter contact holes being formed with openings about 0.25 to 0.8 uM in diameter, resulting in an aspect ratio between about 1 to 3.

30. The method of claim 24, wherein said first titanium nitride barrier layer is deposited using physical vapor deposition process at a temperature between about 200 to 400 deg. C. to a thickness between about 30 to 140 nm.

31. The method of claim 24, wherein said first deposited barrier layer which protrudes and overhangs around the top rim and upper portion of the sub-half-micron contact hole is etched off using a multi-step reactive ion etching with mixtures of etchants composed of $BCl_3$ and $Cl_2$ at a temperature about between 20 and 200 deg. C. under the pressure range between 30 to 300 mtorr and time etched to remove a a portion of said first barrier layer around the top portion of the sub-half-micron contact hole without affecting the integrity and the thickness of said first barrier layer around the lower portion of the wall and bottom of said sub-half-micron contact hole.

32. The method of claim 24, wherein said second barrier layer is TiN, deposited using PVD processing at a temperature between about 200 to 400 deg. C. to create a total uniform thickness in the contact hole between about 30 to 140 nm.

33. The method of claim 24, wherein said metal fill layer is tungsten, deposited using LPCVD processing at a temperature between about 300 to 500 deg. C, to a thickness between about 200 to 800 nm using tungsten hexafluoride, hydrogen, silane and argon or helium.

* * * * *